United States Patent [19]

Weld

[11] Patent Number: 5,696,405
[45] Date of Patent: Dec. 9, 1997

[54] MICROELECTRONIC PACKAGE WITH DEVICE COOLING

[75] Inventor: John David Weld, Succasunna, N.J.

[73] Assignee: Lucent Technologies Inc., Murray Hill, N.J.

[21] Appl. No.: 542,995

[22] Filed: Oct. 13, 1995

[51] Int. Cl.⁶ .......................... H01L 23/34; H01L 23/28; H05K 5/00; H05K 7/20

[52] U.S. Cl. ........................ 257/714; 257/715; 257/796; 361/687; 361/688

[58] Field of Search ................... 257/714, 715, 257/716, 719, 720, 721, 706, 787, 796; 361/687, 688, 689, 690, 694, 696, 697, 698, 703; 29/889.721, 889.5, 889.722, 890.035, 890.038, 890.045, 890.046

[56] References Cited

U.S. PATENT DOCUMENTS

| | | | |
|---|---|---|---|
| 5,052,481 | 10/1991 | Horvath et al. | 257/714 |
| 5,060,115 | 10/1991 | Sewell | 361/388 |
| 5,077,638 | 12/1991 | Andersson et al. | 361/388 |
| 5,105,259 | 4/1992 | McShane et al. | 257/796 |
| 5,109,318 | 4/1992 | Funari et al. | 361/388 |
| 5,157,478 | 10/1992 | Ueda et al. | 257/795 |
| 5,161,087 | 11/1992 | Frankeny et al. | 361/382 |
| 5,218,517 | 6/1993 | Sewell | 361/388 |
| 5,229,918 | 7/1993 | Della Bosca et al. | 257/712 |
| 5,272,599 | 12/1993 | Koenen | 361/710 |
| 5,276,585 | 1/1994 | Smithers | 257/712 |
| 5,276,586 | 1/1994 | Hatsuda et al. | 361/387 |
| 5,280,409 | 1/1994 | Selna et al. | 361/720 |
| 5,282,111 | 1/1994 | Hopfer | 361/704 |
| 5,283,467 | 2/1994 | Goeschel et al. | 257/718 |
| 5,285,350 | 2/1994 | Villaume | 361/690 |
| 5,287,001 | 2/1994 | Buchmann et al. | 257/719 |
| 5,287,248 | 2/1994 | Montesano | 361/708 |
| 5,287,249 | 2/1994 | Chen | 361/718 |
| 5,293,930 | 3/1994 | Pitasi | 257/722 |
| 5,295,043 | 3/1994 | Beijer | 361/704 |
| 5,296,402 | 3/1994 | Ryou | 437/60 |
| 5,299,090 | 3/1994 | Brady et al. | 257/722 |
| 5,304,845 | 4/1994 | Lindquist et al. | 257/722 |
| 5,307,239 | 4/1994 | McCarthy et al. | 361/704 |
| 5,307,519 | 4/1994 | Mehta et al. | 361/704 |
| 5,309,315 | 5/1994 | Naedel et al. | 361/704 |
| 5,309,979 | 5/1994 | Brauer | 257/718 |
| 5,309,983 | 5/1994 | Bailey | 257/722 |
| 5,325,266 | 6/1994 | Lim | 361/704 |
| 5,329,426 | 7/1994 | Villani | 361/719 |
| 5,339,215 | 8/1994 | Nishiguchi | 361/704 |
| 5,345,107 | 9/1994 | Daikoku et al. | 257/717 |
| 5,349,237 | 9/1994 | Sayka et al. | 257/796 |
| 5,353,193 | 10/1994 | Chia et al. | 361/704 |
| 5,365,107 | 11/1994 | Kuraishi et al. | 257/673 |
| 5,365,399 | 11/1994 | Kent et al. | 361/704 |
| 5,367,433 | 11/1994 | Blomquist | 361/704 |
| 5,381,305 | 1/1995 | Harmon et al. | 361/704 |
| 5,390,734 | 2/1995 | Voorhes et al. | 165/185 |
| 5,394,936 | 3/1995 | Budelman | 257/714 |
| 5,396,338 | 3/1995 | Sato et al. | 358/341 |
| 5,406,807 | 4/1995 | Ashiwake et al. | 361/699 |
| 5,430,331 | 7/1995 | Hamzehdoost et al. | 257/796 |

*Primary Examiner*—Mahshid D. Saadat
*Assistant Examiner*—Jhihan B. Clark

[57] ABSTRACT

A microelectronics package has improved device cooling. The package includes a lead frame defining an upper and lower surface. An active electronic device, such as an integrated circuit, is positioned above the upper surface of the lead frame. An encapsulating package is molded around both the lead frame and the active electronic device to form the microelectronic package. A cooling tube is integrally molded within the encapsulating package and typically formed of a thermally conductive material such as copper. A cooling fluid, such as air or a liquid, can be moved through the cooling tube for discharging the heat generated by the active electronic device.

21 Claims, 3 Drawing Sheets

MICROELECTRONIC PACKAGE WITH DEVICE COOLING

FIELD OF THE INVENTION

This invention relates to a microelectronic package with improved device cooling, and more particularly to a microelectronic package having a lead frame, an active electronic device, and an encapsulated package molded around the lead frame and the active electronic device with improved cooling of the active electronic device.

BACKGROUND OF THE INVENTION

Microelectronic packages are continuously increasing in computational capacity and performance through increased circuit density and improved sub-micron circuit technologies, increased input-output capabilities, multi-chip module technology, and a larger integrated circuit chip relative to the size of the package. With this increased performance, there is an increase in the power density, resulting in an increase in the operating temperature of the package. It is well known by those skilled in the art that the reliability of a package is directly related to its operating temperature. The optimum performance of a microelectronic package is obtained only when the heat generated by a chip or plurality of chips (i.e., an active electronic device) is efficiently removed.

Some of these electronic packages include a lead frame with an upper and lower surface and an active electronic device, such as an integrated circuit or chips mounted on a silicon die and positioned above and attached to the upper surface of the lead frame with a thermally conductive adhesive. An encapsulating package is molded around the lead frame and chip and forms a typically substantially flat, rectangular configured microelectronic package. In some applications, cooling fins are mounted on top of the package by a heat conductive adhesive and acts as a heat sink. Typically air is blown over the fins. In this type of microelectronics package, approximately 94% of the heat generated by the chips propagates into the silicon die towards a die adhesive and the lead frame, with the remaining 6% propagating into the epoxy molding compound layer adjacent the chips and forming the encapsulating package.

Typical package designs place the chips above the lead frame so that when the package is mounted onto a circuit board, the high heat side of the package faces the circuit board. With a typical 0.020 inch stand-off of the package from the circuit board, the majority of the heat generated into the electronics package migrates towards the small gap between the electronics package and the circuit board. Air cooling is accomplished by blowing with forced flow, or using the natural buoyancy-induced convective flow of air.

However, the low thermal capacity of the air requires a large volumetric air flow to adequately cool a microelectronic package. Heat sinks sometimes are mounted on the outside surface of the package to increase the package surface area for cooling. Sometimes the heat sinks may be metallic, conductive dies positioned within the package. For example, one thermal management technique includes a molded-end heat slug inserted in the package. The slug is a solid material having a higher thermal conductivity than the epoxy molding compound forming the body of the package. Typically, the heat slug can be aluminum or copper and forms a direct heat conduction path to the surface of the package. Air cooling is then used to expel the heat away from the slug.

This type of arrangement is expensive and difficult to manufacture and does not always provide an acceptable means for reducing the generated heat.

SUMMARY OF THE INVENTION

The foregoing problems are overcome with the microelectronic package which includes improved device cooling of the present invention. The microelectronic package includes a lead frame defining an upper and lower surface. An active electronic device, such as an integrated circuit, is positioned above and attached to the upper surface of the lead frame with a thermally conductive adhesive. An encapsulating package, such as formed from an epoxy molding compound is molded around the lead frame and active electronic device and forms the microelectronic package. A cooling tube can be integrally molded within the encapsulating package. A cooling fluid is delivered through the cooling tube. The cooling fluid could be air or refrigerant or some other liquid.

In one aspect of the present invention, the cooling tube is mounted in spaced relation above the active electronic device. In still another aspect of the present invention, the cooling tube is mounted against a lead frame opposite the active electronic device.

The active electronic device can be one or more integrated circuits, and in a preferred aspect of the present invention, the cooling tube is formed in a serpentine configuration within the package. The cooling tube is formed of a thermally conductive material such as copper or aluminum. The cooling tube typically has a diameter of about 0.025 inches and an inner diameter of about 0.015 inches. The cooling tube has two ends that extend outward from an edge face of the package.

DESCRIPTION OF THE DRAWINGS

The advantages of the present invention will be appreciated more fully from the following description, with references to the accompanying drawings in which.

DETAILED DESCRIPTION OF THE INVENTION

Figure 1:
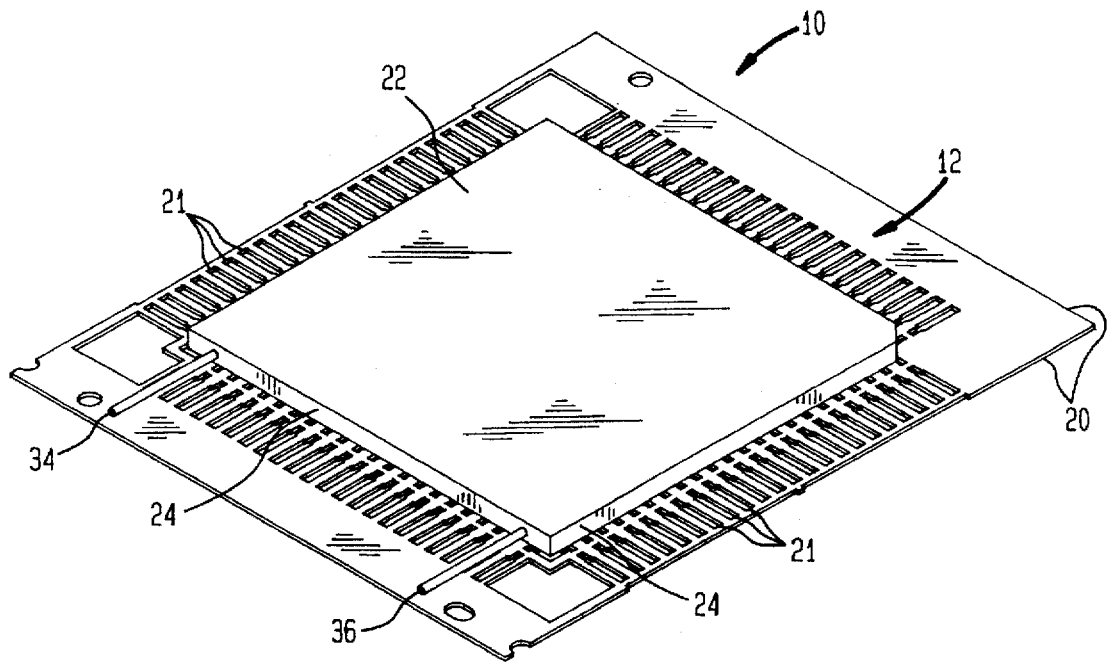
FIG. 1 is an isometric view of a microelectronic package with two cooling tubes molded within the package, one suspended above the active electronic device and one positioned below but in contact with the lead frame.
Figure 2:
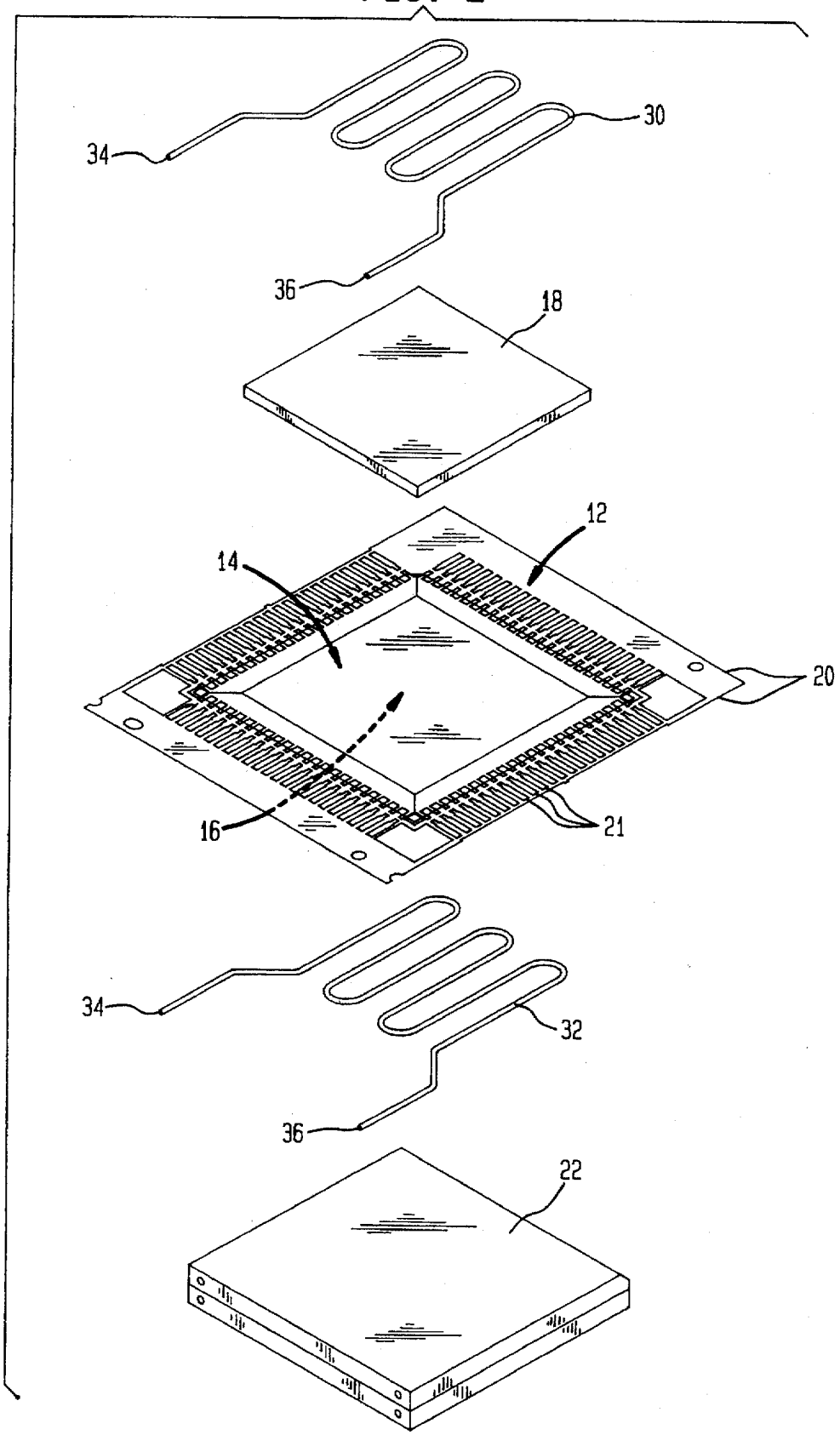
FIG. 2 is an exploded isometric view of the microelectronic package of FIG. 1 showing placement of the cooling tubes with regard to other components of the package.

Referring now to FIG. 1, there is illustrated generally at 10 a microelectronic package of the present invention having improved cooling of an active electronic device, such as an integrated circuit or series of chips. FIG. 2 illustrates an exploded view of the various components of this improved microelectronic package 10. As illustrated, a lead frame die paddle 12 has top and bottom surfaces 14, 16 and receives the active electronic device on its top surface 14. Typically, the active electronic device 18 is a multi-chip module on a silicon substrate. The device 18 can include several active chips or integrated circuits bonded to the silicon substrate. For purposes of clarity, the active electronic device 18 will be referred to hereafter as a chip. The lead frame 12 includes a substantially planar, peripheral portion 20 extending outward from the chip 18 to form a plurality of leads 21 that connect to a circuit board. An epoxy molding compound body (package) 22 is molded over the lead frame and forms the substantially flat, rectangular package 10 having side faces 24 as illustrated. Although a rectangular configured package 10 is illustrated and preferred, the package 10 can be almost any configuration desired by those skilled in the art.

Figure 3:
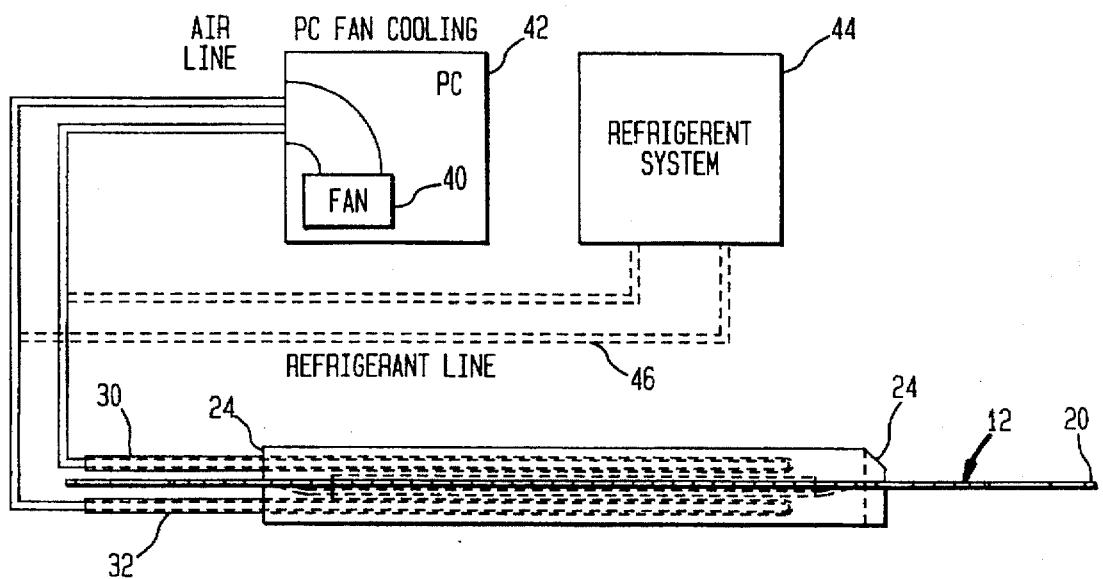
FIG. 3 is a schematic sectional view of the microelectronic package of FIG. 1 and showing schematically two possible cooling systems.
Figure 4:
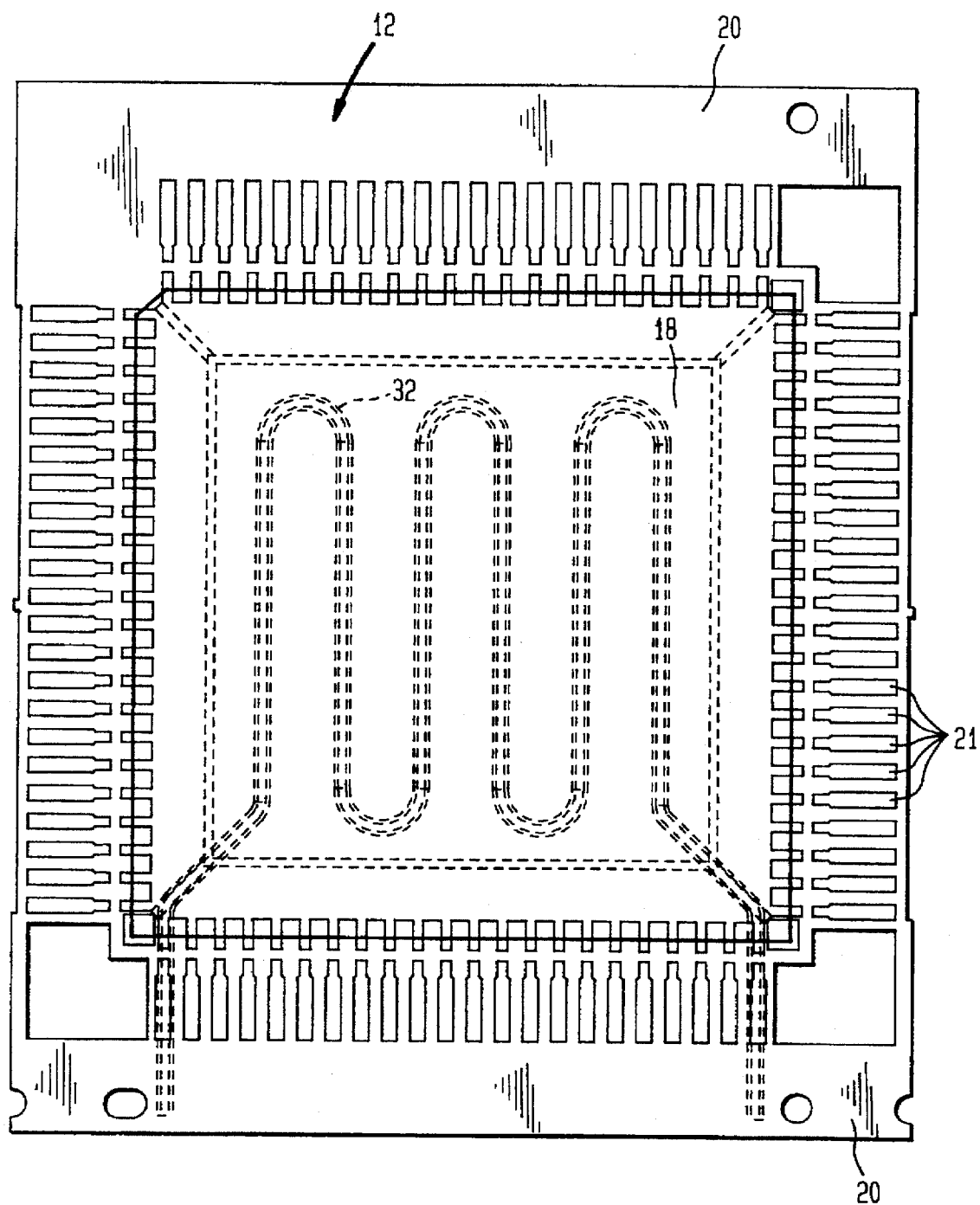
FIG. 4 is a schematic plan view of the microelectronic package of FIG. 1 showing the cooling tube positioned relative to the lead frame.

In accordance with the present invention, at least one cooling tube 30 is integrally molded within the encapsulating package in a typically serpentine manner as illustrated. The cooling tube 30 is formed of a thermally conductive material, such as copper or aluminum, and can be about 0.025 inches outer diameter and about 0.015 inches inner diameter. In one aspect of the present invention, the cooling tube 30 is spaced from the top surface 14 of the lead frame 12 and chip 18 as shown in FIGS. 3 and 4. During manufacture, the cooling tube 30 is typically cantilevered over the chip 18 and supported by inserts in the mold or supporting elements on the lead frame (not shown). Then the epoxy molding compound is molded over the cooling tube 30, lead frame 12 and chip 18.

In another aspect of the present invention, a second cooling tube 32, either singularly or in combination with the other cooling tube 30 is placed on the back side and mounted adjacent and preferably against the lead frame on the opposite side of the chip 18. In either configuration, however, the cooling tubes 30, 32 have two ends 34, 36 that extend outward from a side face 24 of the package 10. The illustrated figures show the two cooling tubes 30, 32 in the two locations as described above. Because the cooling tube 30 is formed from a high heat conductive material, such as copper or aluminum, heat generated by the integrated circuit is conducted through the cooling tube 30 and removed from the package 10.

In a preferred aspect of the present invention, a cooling fluid is pumped through the cooling tube 30. The cooling fluid can be air such as provided by a normal fan 40 used in a personal computer 42, shown schematically in FIG. 3. In still another aspect of the present invention, the cooling fluid can be a liquid, such as water, or even a refrigerant. As shown schematically in FIG. 2, the refrigerant could be cycled by a refrigerant system 44 with flash vaporization and act as a two-leg natural convection loop so that the refrigerant flows through the refrigerant line, indicated by dotted line 46 without the need for any refrigerant pump. The heat generated by the chip 18 will provide part of the convective loop power necessary for moving the refrigerant.

It should be understood that the foregoing description of the invention is intended merely to be illustrative thereof and that other embodiments, modifications, and equivalents may be apparent to those skilled in the are without departing from its spirit.

That which is calimed is:

1. A microelectronic package with improved device cooling comprising a lead frame defining an upper and lower surface, an active electronic device positioned above the upper surface of the lead frame, an encapsulating package molded around the lead frame and the active electronic device and forming the microelectronic package, a cooling tube integrally molded within the encapsulating package and including means for delivering a cooling fluid through the cooling tube.

2. The package according to claim 1 wherein the cooling fluid is air.

3. The package according to claim 1 wherein the cooling fluid is a refrigerant.

4. The package according to claim 1 wherein the cooling tube mounted in spaced relation above the active electronic device.

5. The package according to claim 1 wherein the cooling tube mounted against the lead frame opposite the active electronic device.

6. The package according to claim 1 wherein said encapsulating package is formed from an epoxy molding compound.

7. The package according to claim 1 wherein said active electronic device comprises at least one integrated circuit.

8. The package according to claim 1 wherein said cooling tube is formed in a serpentine configuration within the encapsulating package.

9. The package according to claim 1 wherein said cooling tube is formed of a thermally conductive material.

10. The package according to claim 1 wherein said cooling tube includes an outer diameter of about 0.025 inches and an inner diameter of about 0.015 inches.

11. The package according to claim 1 wherein said encapsulating package forms a substantially flat, rectangular configured package having at least one edge face wherein said cooling tube has two ends extending outward from an edge face.

12. The package according to claim 10 wherein said cooling tube is formed of copper.

13. A microelectronic package with improved device cooling comprising a lead frame defining an upper and lower surface, an active electronic device positioned above the upper surface of the lead frame, an encapsulating package molded around the lead frame and the active dectronic device and forming the microelectronic package, a cooling tube integrally molded within the encapsulating package, wherein said cooling tube is formed of a thermally conductive material and positioned in one of two heat discharge positions selected from a position spaced above the active electronic device and a position mounted against the lead frame opposite the active electronic device and including means for delivering a cooling fluid through the cooling tube.

14. The package according to claim 13 wherein the cooling fluid is air.

15. The package according to claim 13 wherein the cooling fluid is a refrigerant.

16. The package according to claim 13 wherein said encapsulating package is formed from an epoxy molding compound.

17. The package according to claim 13 wherein said active electronic device comprises at least one integrated circuit.

18. The package according to claim 13 wherein said cooling tube is formed in a serpentine configuration within the encapsulating package.

19. The package according to claim 13 wherein said cooling tube is formed of copper.

20. The package according to claim 13 wherein said cooling tube includes an outer diameter of about 0.025 inches and an inner diameter of about 0.015 inches.

21. The package according to claim 13 wherein said encapsulating package forms a substantially flat, rectangular configured package having at least one edge face, wherein said cooling tube has two ends extending outward from an edge face.

* * * * *